(12) United States Patent
Bryan et al.

(10) Patent No.: US 11,319,779 B1
(45) Date of Patent: May 3, 2022

(54) SYSTEM AND METHOD THERMOPILE ENERGY HARVESTING FOR SUBSURFACE WELL BORE SENSORS

(71) Applicant: National Technology & Engineering Solutions of Sandia, LLC, Albuquerque, NM (US)

(72) Inventors: Charles R. Bryan, Albuquerque, NM (US); Jason E. Heath, Edgewood, NM (US); Chowdary Ramesh Koripella, Albuquerque, NM (US); Thomas Dewers, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 29 days.

(21) Appl. No.: 16/912,778

(22) Filed: Jun. 26, 2020

(51) Int. Cl.
*E21B 41/00* (2006.01)
*H01L 35/30* (2006.01)
*H01L 35/32* (2006.01)
*E21B 49/08* (2006.01)
*E21B 47/005* (2012.01)
*E21B 47/10* (2012.01)
*E21B 47/06* (2012.01)

(52) U.S. Cl.
CPC .......... *E21B 41/0085* (2013.01); *H01L 35/30* (2013.01); *H01L 35/32* (2013.01); *E21B 41/0064* (2013.01); *E21B 47/005* (2020.05); *E21B 47/06* (2013.01); *E21B 47/10* (2013.01); *E21B 49/0875* (2020.05)

(58) Field of Classification Search
CPC ............ E21B 41/0085; E21B 49/0875; E21B 41/0064; E21B 47/005; E21B 47/10; E21B 47/06; H01L 35/30; H01L 35/32
See application file for complete search history.

(56) References Cited

U.S. PATENT DOCUMENTS

| | | | | |
|---|---|---|---|---|
| 6,150,601 A * | 11/2000 | Schnatzmeyer | ........ | H01L 35/00 136/201 |
| 2005/0067005 A1* | 3/2005 | Van Der Spek | ........ | H01L 35/30 136/205 |
| 2007/0151591 A1* | 7/2007 | Jeffryes | ............... | E21B 41/0085 136/240 |
| 2015/0027507 A1* | 1/2015 | Noui-Mehidi | .......... | H01L 35/30 136/201 |
| 2018/0202288 A1* | 7/2018 | Elbadawy | ................. | E21B 7/04 |
| 2018/0313192 A1* | 11/2018 | Frosell | ................... | H02N 11/00 |
| 2020/0362691 A1* | 11/2020 | Joshi | ....................... | E21B 47/07 |

* cited by examiner

*Primary Examiner* — Brad Harcourt
(74) *Attorney, Agent, or Firm* — Daniel J. Jenkins

(57) ABSTRACT

A system and method for powering a borehole sensor with thermal energy is disclosed. The system includes a tubular pipe inserted into a subsurface borehole. A borehole casing is coaxially disposed with the tubular pipe. An annular space between the casing and the tubular pipe has a power source placed in the borehole to power a sensor in response to a temperature gradient between a surface of the casing and a surface of the tubular pipe. The method includes attaching thermopiles on the borehole casing or tubing; placing the thermopile in the annulus between the casing and the tubing; inducing a thermal gradient across the thermopile; generating an electrical energy in response to the temperature gradient; powering the sensor from the generated energy; and monitoring vertical expansion of a $CO_2$ plume.

21 Claims, 4 Drawing Sheets

SYSTEM AND METHOD THERMOPILE ENERGY HARVESTING FOR SUBSURFACE WELL BORE SENSORS

STATEMENT REGARDING FEDERALLY SPONSORED RESEARCH OR DEVELOPMENT

This invention was developed under Contract No. DE-NA0003525 awarded by the United States Department of Energy/National Nuclear Security Administration. The Government has certain rights in this invention.

BACKGROUND OF THE INVENTION

The application generally relates to a system and method of energy harvesting. The application relates more specifically to energy harvesting for subsurface well bore sensors using thermopiles.

Subsurface sequestration is currently the only viable option for reducing atmospheric emissions of $CO_2$ from industrial processes. Large-scale pilot programs have been established to obtain baselines for monitoring efforts, monitor effectiveness of injection and storage operations, and provide test-beds for injection, storage and monitoring operations. There is a need for improved understanding of $CO_2$ movement within reservoirs and caprock, and potential leakage pathways along the wellbore. Spatially distributed downhole sensors capable of collecting short to long-term data, e.g., hours to years, will allow application of large scale data collection to quantify the real-time to long-term stability and safety of subsurface $CO_2$ sequestration. Such data collection supports assessment of wellbore health, induced seismicity, and fluid movement that may impact underground sources of drinking water. Many other field operations exist that would benefit from such monitoring capabilities for safety and improving operations, including enhanced oil recovery and enhanced geothermal systems. The technologies discussed herein extend to any similar downhole monitoring and characterization activities.

Recently small-scale technologies have been developed for subsurface sensing and control. Current battery life for existing sensors ranges from ten to forty hours for a 5-12 millimeter (mm) temperature/pressure/time system, and from ten to sixteen hours for 8 mm temperature/pressure/time system. System size affects battery size and life Another option with no battery is radio frequency (RF) powered and provides 1 mm, Resistivity/pH/temp/press.

What is needed is a system and/or method that satisfies one or more of these needs or provides other advantageous features. Other features and advantages will be made apparent from the present specification. The teachings disclosed extend to those embodiments that fall within the scope of the claims, regardless of whether they accomplish one or more of the aforementioned needs.

SUMMARY OF THE INVENTION

One embodiment relates to a system for powering a borehole sensor with thermal energy. The system includes a tubular pipe inserted into a subsurface borehole. A borehole casing is in thermal contact with an inner wall of the borehole. The casing is coaxially disposed with the tubular pipe to form an annular space between the casing and the tubular pipe. A power source is placed within the borehole and is in electrical communication with the sensor. The power source generates an electrical power in response to a temperature gradient between a surface of the casing and a surface of the tubular pipe.

Another embodiment relates to a system for sensing environmental parameters in a subsurface borehole. The system includes a tubular pipe that is inserted into a subsurface borehole. A borehole casing is placed in thermal contact with an inner wall of the borehole. The casing is coaxial with the tubular pipe and forms an annular space between the casing and the tubular pipe. A thermopile is placed within the borehole and is in electrical communication with the sensor. The thermopile generates an electrical power in response to a temperature gradient between a surface of the casing and a surface of the tubular pipe. The thermopile further senses heat flux in response to changes in the thermal conductivity of a formation surrounding the borehole. The thermal conductivity determines saturation in the surrounding formation material and displacement of pore water in a casing cement in the surrounding formation due to hydrocarbon $scCO_2$ into the formation.

Another embodiment relates to a method of harvesting thermal energy for powering a sensor in a subsurface borehole in a geological formation is disclosed, wherein the borehole includes an annular gap between a production tubing portion and a borehole casing. The method includes attaching at least one thermopile on a surface of the borehole casing or the production tubing; disposing the at least one thermopile in the annular gap between the borehole casing and the production tubing; inducing a thermal gradient across between the tubing and the casing across the at least one thermopile; generating an electrical energy in response to the gradient; powering the sensor from the generated electrical energy; and monitoring a vertical expansion of a $CO_2$ plume adjacent the borehole.

Certain advantages of the embodiments described herein are a novel method for powering sensors in the subsurface and a new sensor for measuring displacement of pore water in casing cement, gas leakage, and movement of hydrocarbon or supercritical carbon dioxide ($scCO_2$) plume within a reservoir or gaseous $CO_2$ if the method is deployed at shallow depths where $CO_2$ has changed phase.

Another advantage is the use of thermoelectric modules, or thermoelectric generators (TEG) to convert heat directly into electric power. Solid-state heat engines require no moving parts, are robust and are very reliable in long-life applications. TEG take advantage of the Seebeck Voltage such that a temperature differential maintained across a thermoelectric couple generates a voltage. TEG consist of several P-type and N-type thermoelectric legs connected in series or series-parallel combination.

Still another advantage of subsurface energy harvesting is a reliable long-term power source for wireless, self-sufficient sensor networks for real-time to long-term monitoring of $CO_2$ plumes and the health of injection/monitoring wells and fluid migration towards underground sources of drinking water. TEGs utilize the small temperature differentials that exist in actively pumped wells. When additional power is required, thermal pulses, or intermittent pumping, can generate greater temperature gradients to increase power output. Long-term power supplies may be coupled with a power conditioning circuit and a rechargeable battery.

Thermoelectric modules may also be configured as sensors to monitor temperature and near-field/far-field thermal conductivity changes, with emplacement optionally on the production tubing and/or on the external casing surface.

Still another advantage is that thermoelectric generators are scalable. Increased voltage or power output can be achieved by simply adding additional TEGs in series or in parallel.

The disclosed system and methods provide support for real-time high-resolution monitoring, for faster response time in cases of pressure build-up and leakage The disclosure further provides a charging mechanism for long-term monitoring, as battery lifetimes for wireless embedded sensors are short. Thermopiles may also be used as sensors for tracking $CO_2$ or other fluid movement within wall rock or casing cement.

Alternative exemplary embodiments relate to other features and combinations of features as may be generally recited in the claims.

BRIEF DESCRIPTION OF THE DRAWINGS

The application will become more fully understood from the following detailed description, taken in conjunction with the accompanying figures, wherein like reference numerals refer to like elements, in which.

DETAILED DESCRIPTION OF THE INVENTION

Before turning to the figures which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

As described in greater detail below, a thermopile consists of chained thermocouples, with the location of the junctions alternating between a "hot side" and the "cold side" of an intervening surface. The temperature differential between hot and cold sides drives a heat flux, which is converted into electricity by the thermopile. By connecting the thermocouples in series or in parallel, either the voltage or the current output of the thermopile may be increased. In an embodiment the thermopile may extend the length of pipe, a single section of pipe or production tubing, or pipe, in a drill string, ranging up to 40 feet or longer. Temperature gradients through a borehole casing may be low level, but sufficient to generate small currents through the use of thermopiles. Accumulation of electrical charging current through a battery is possible for long term operation of a downhole sensor. A sensor package and thermopile power supply may be attached to the outside of the casing prior to emplacement. If heat flux across the casing or tubing is insufficient, a thermal pulse generated by pumping heated or cooled fluid into the borehole provides increased temperature gradient and increase the heat flux into or out of the borehole, which is harvested by the thermopile to generate power and charge a permanently-emplaced sensor on the outside of the casing. This method allows wireless charging of subsurface sensors as the power is harvested in situ in the downhole environment.

Energy generated by the thermopile powers a sensor for measuring various parameters of the subsurface environment and transmits recorded data to a downhole tool or communication device. From within a cement-filled annulus, the properties that a sensor measures includes pore pressure, as transmitted through the cement pore fluid, conductivity, tracking of fluid flow and fluid compositional changes over time.

Figure 1:
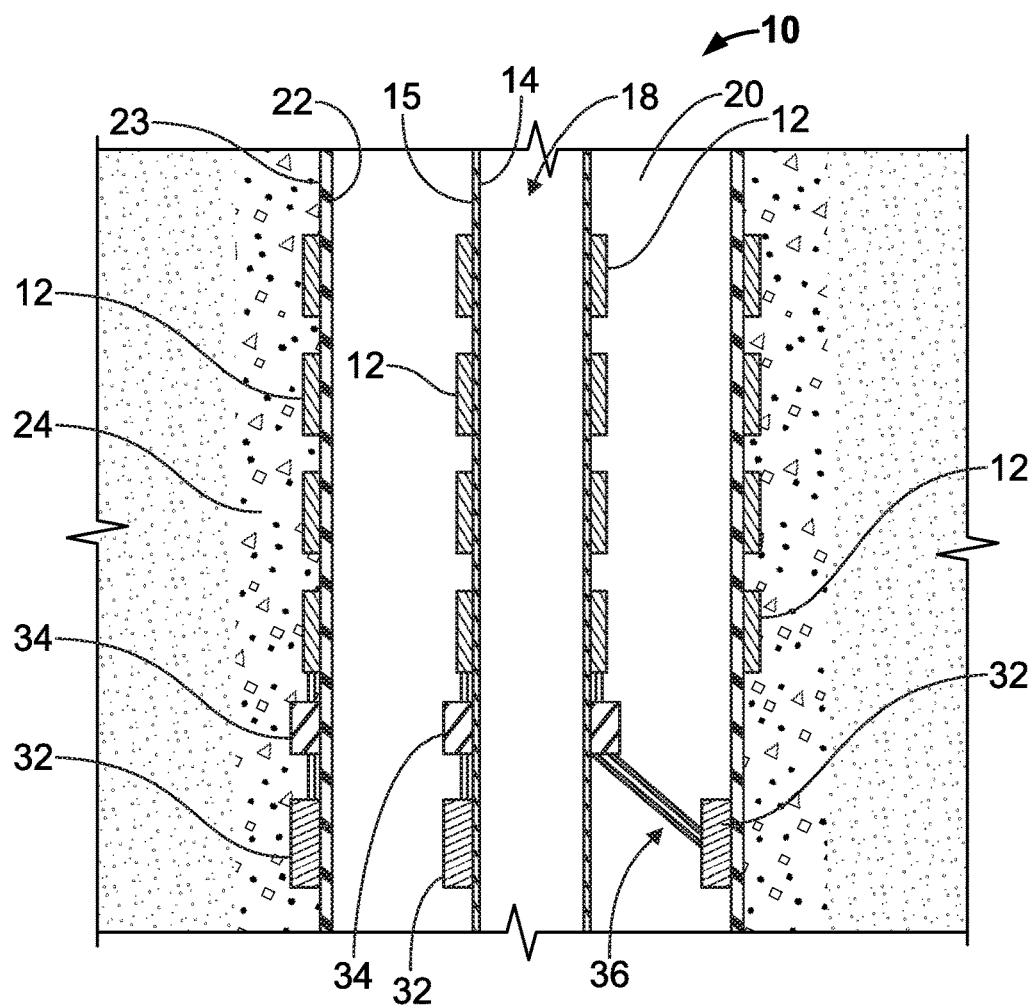
FIG. 1 shows an exemplary energy harvesting system of the present invention.

Referring to FIG. 1, an energy harvesting system 10 is shown. Thermopiles 12 are attached to a longitudinal section or sections of production tubing 14 along an exterior surface 15 of tubing 14. Production tubing is then inserted into a borehole 18, e.g., a $CO_2$ injection borehole. Borehole 18 include an annular space or gap 20 formed between tubing 14 and a borehole casing 22. Any space between borehole casing 22 and the wall rock is filled with cement. The annular space 20 is filled with brine, typically, although not required for the energy harvesting system. Borehole casing 22 is in contact with wall surface 24. Wall surface 24 may be a cement filler inserted in the borehole construction process, or a solid rock formation into which the borehole is drilled. Alternately, thermopiles may be disposed within wall surface 24, e.g., embedded into the cement or rock formation prior to encasing borehole 18, with the thermopiles in thermal contact with the exterior surface 23 of borehole casing 22. Borehole casing 22 may be composed of steel or other suitable metal.

Thermopiles 12 are comprised of an array of thermoelectric generator (TEG) modules 30 (see, e.g., FIG. 6), which are described in greater detail below. TEG modules 30 may be interconnected in series or parallel to generate a predetermined voltage and current output for powering a sensor package 32. A power conditioner module 34 may optionally be connected to an output of thermopile 12, before sensor package 32 to regulate the electrical signal input to sensor package 32. In still another embodiment, thermopiles may be disposed on both production tubing sections 14 and casing 22, for redundancy of power sources or additional power output.

A sensor package 32 may be disposed at various locations in borehole 18. As shown in FIG. 1, a sensor package 32 may be attached to surface 15 of production tubing 14, e.g., at the end of one or more thermopiles 12, or adjacent to power conditioner module 34. Alternatively, sensor package 32 may be disposed on casing 22 interiorly, opposite surface 15, or secured to surface 15 by a spring-loaded positioning device 36. When the system 10 embodiment includes wall-embedded thermopiles, sensor package 32 and power conditioner module 34 are also embedded within wall 24. In another embodiments, sensors may be attached to the exterior surface of casing 22, allowing monitoring of conditions in the cement or wall rock 24, and powered wirelessly using thermopiles on the inside of the casing 22 or on production tubing 14 by transmitting power through the casing.

Figure 2:
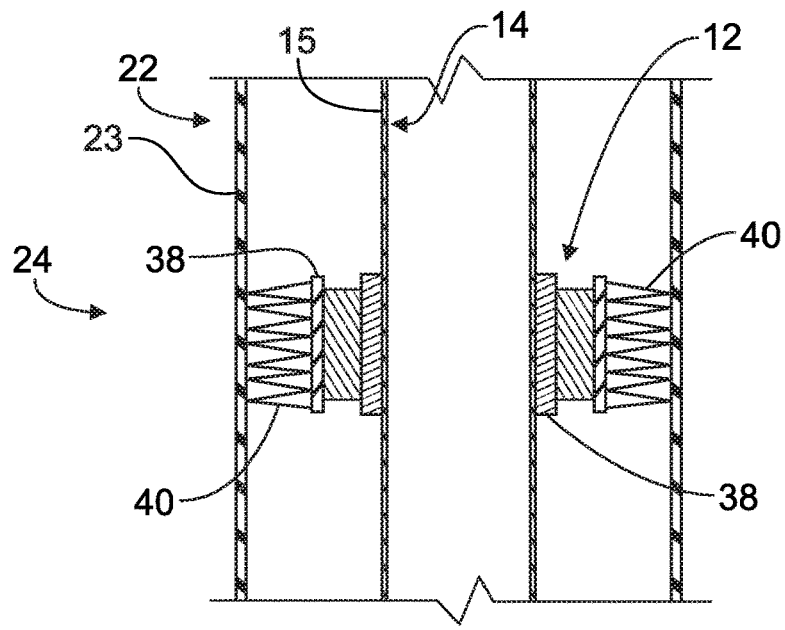
FIG. 2 is a sectional elevation view of an exemplary embodiment of the energy harvesting system of FIG. 1.
Figure 3:
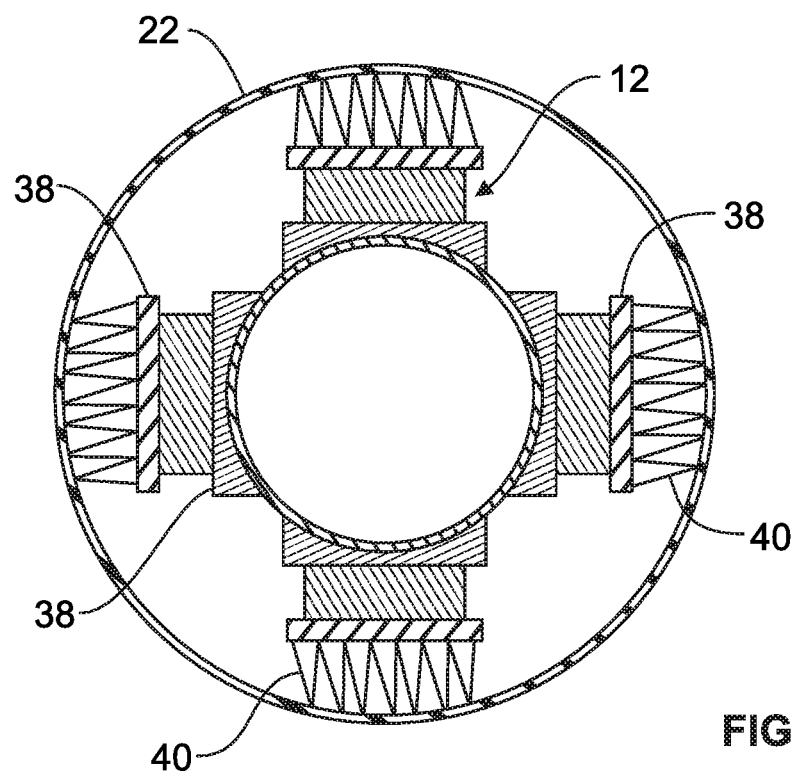
FIG. 3 shows a cross-sectional view of the thermopile arrangement of FIG. 2.
Figure 4:
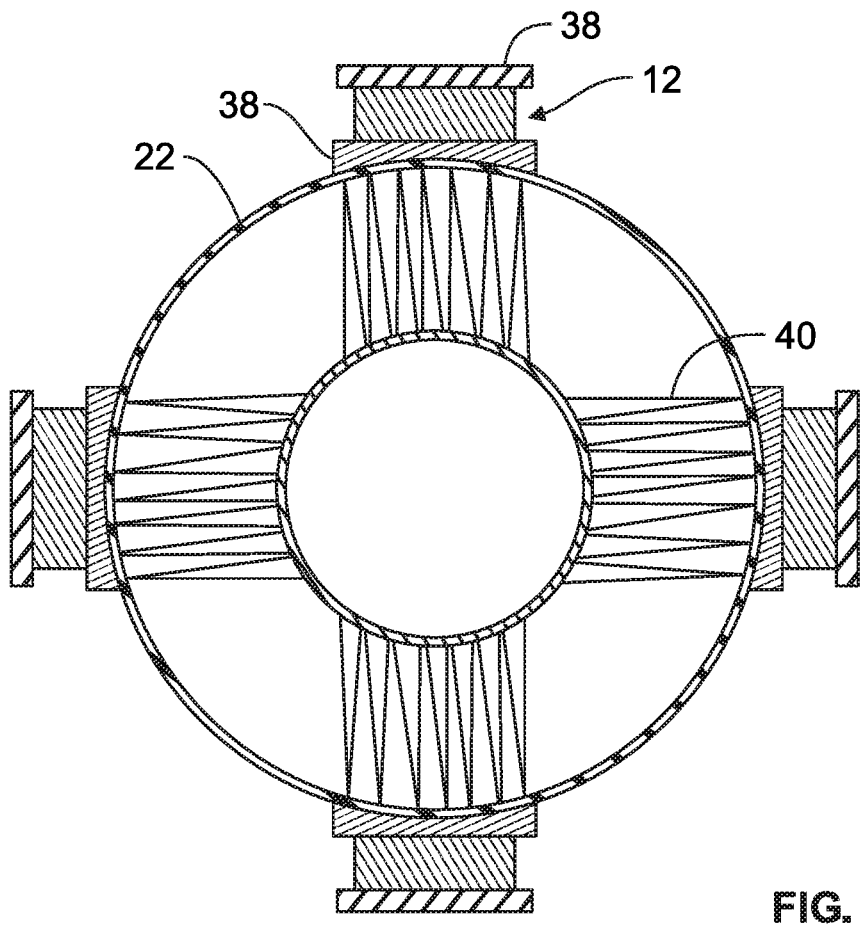
FIG. 4 shows a cross-sectional view of the thermopile arrangement of FIG. 1 with placement of thermopiles outside of casing.

Referring next to FIG. 2, a sectional elevation view of an exemplary embodiment is shown. Thermopiles 12 may be mounted around the circumference of production tube 14 and provided with an enhanced thermal interface for efficient heat transfer. Multiple thermopiles 12 may be added around the production tube 14 for additional power generation. On the exterior surface of thermopiles 12, a thermal conductor 40 made from flexible metal fins, mesh or wire brush material is disposed in thermal contact between casing 22 and surface 15 of production tubing 14 to promote heat transfer to the casing. The flexible thermal conductor 40 will allow easy removal of production tube 14, e.g., for performing maintenance operations on borehole 18. Thermal interface portions 38 are provided at opposing ends of thermopile 12. FIG. 3 shows a cross-sectional view of the thermopile arrangement of FIG. 2. In an alternate embodiment shown in FIG. 4, a cross-sectional view of the thermopile arrangement is shown with placement of thermopiles 12 outside of casing 22 embedded in wall 24. Thermopiles may also be placed on the inside surface of casing 22.

Figure 5:
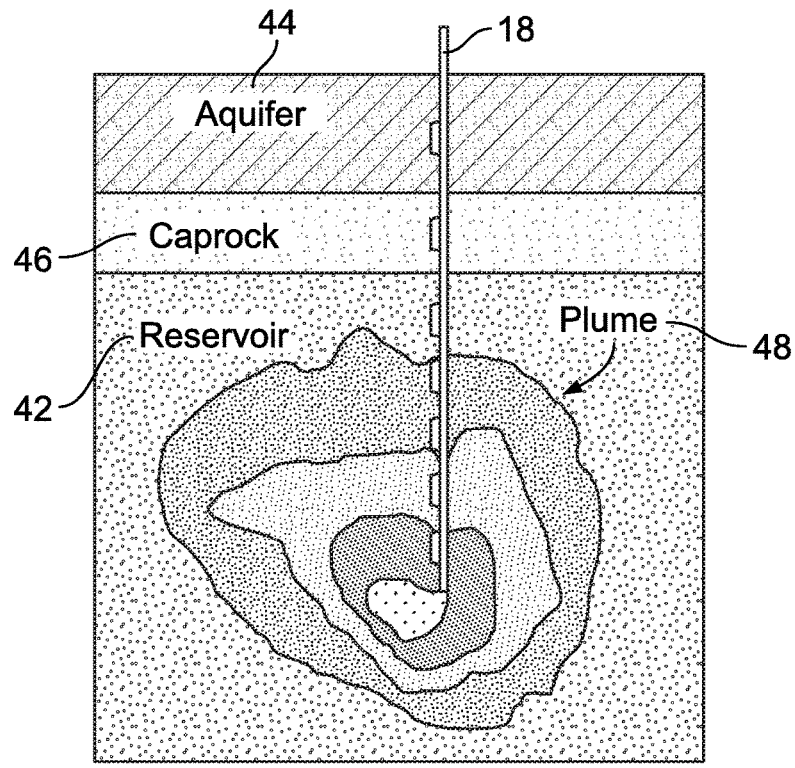
FIG. 5 shows an exemplary application of the energy harvesting system borehole drilled into a reservoir.

Referring next to FIG. 5, an exemplary application of the energy harvesting system 10 is shown. Borehole 18 is drilled into a reservoir 42, underlying an aquifer 44 and a capstone layer 46. Thermopiles 12 in borehole 18, e.g., a $CO_2$ injection borehole, are configured to monitor the vertical expansion of the $CO_2$ plume 48 in the vicinity of borehole 18, or other fluid movements that alter thermal gradients and bulk thermal conductivity. Power generated by the thermopile is applied to power a sensor for measuring aspects or parameters of the subsurface environment, and transmitting accumulated recorded data, e.g., to a downhole tool. Sensor may sense pressure or fluid conductivity, liquid saturation, or dielectric properties of pore fluids in the casing cement. Monitoring environmental parameters in borehole 18 provides tracking of fluid flow or fluid compositional changes over time. Thermopile 12 may be configured as a sensor. Current generated by thermopile 12 placed on the outside of casing 22 is a function of the heat flux. Heat flux is a function of the thermal conductivity of the surrounding rock or wall 24. The thermal conductivity indicates the degree of fluid saturation in the surrounding material or formation, thus the thermopile 12 monitors displacement of pore water in the casing cement or in the wall-rock, caused by movement of hydrocarbon or $scCO_2$ into the rock. A series of sensor packages 32 may be attached to production tubing 14 in an $scCO_2$ injection field, for monitoring upward expansion of the $CO_2$ plume 48 within reservoir 42 or other fluid movements that alter thermal gradients and bulk thermal conductivity. Thermopiles 12 also monitor changes in the cement thermal conductivity caused by changes in saturation related to gas leakage in the annulus 20. By introducing a thermal pulse and monitoring changes in the heat flux as it decays, local changes in thermal conductivity due to flow of $CO_2$ in annulus 20 is distinguishable from regional changes caused, e.g., by changes in aquifer saturation due to plume 48 expansion. Thermopile 12 may also detect changes in thermal conductivity of a cement sheath containing the thermopile, where the changes may be associated with alteration or damage to the cement sheath, and thus monitor wellbore integrity in the vicinity of the thermopile arrangement.

The system and method for subsurface energy harvesting with thermopiles provides a reliable long-term power source for wireless, self-sufficient sensor networks for long-term monitoring of $CO_2$ plumes and the health of injection/monitoring wells. TEGs utilize small temperature differentials that exist in actively pumped wells. Additional power may be generated by creating greater temperature differentials. Thermal pulses intermittently pumped into the borehole 18 generate larger temperature gradients and increase power output from thermopiles 12 when additional power is required. Thermopiles 12 may be coupled with a power conditioning circuit 34 including a rechargeable battery to provide long-term sensor power.

Thermopiles 12 may be configured as sensors to monitor temperature and near-field/far-field thermal conductivity changes. The electrical current generated by a thermopile 12 disposed on the exterior surface 23 of casing 22 is a function of the heat flux through the casing, which in turn is a function of the thermal conductivity of the surrounding rock 24. Thermopiles in geothermal wells may determine heat flux through the casing as a function of the thermal conductivity of the surrounding rock formation. The thermal conductivity is strongly affected by the degree of fluid saturation of the rock formation and may be used to monitor displacement of pore water in the rock formation and wellbore environment by fluid movement such as hydrocarbon or $CO_2$. In an embodiment, a series of thermopiles 12 attached to casing 22 inserted in a $scCO_2$ injection field senses the decay of a thermal pulse injected down the borehole 18. Movement of $CO_2$ within the annulus of the borehole, upward expansion of the $CO_2$ plume within reservoir 42 and degree of saturation, e.g., the degree of gangliar flow vs complete displacement, may be measured and tracked by deconvolution of near-field effects vs larger-scale, far-field variations in thermal conductivity. Monitoring may be performed at any depth. $CO_2$ could be shallow and thus liquid or gaseous $CO_2$. For enhanced geothermal systems, steam movement may also be monitored.

Thermopiles may also sense changes in the cement thermal conductivity caused by changes in saturation related to gas leakage up the annulus. By introducing a thermal pulse and monitoring changes in the heat flux as it decays, thermopiles distinguish local changes in thermal conductivity due to flow of $CO_2$ up the annulus from regional changes caused by changes in aquifer saturation due to plume expansion.

Figure 6:
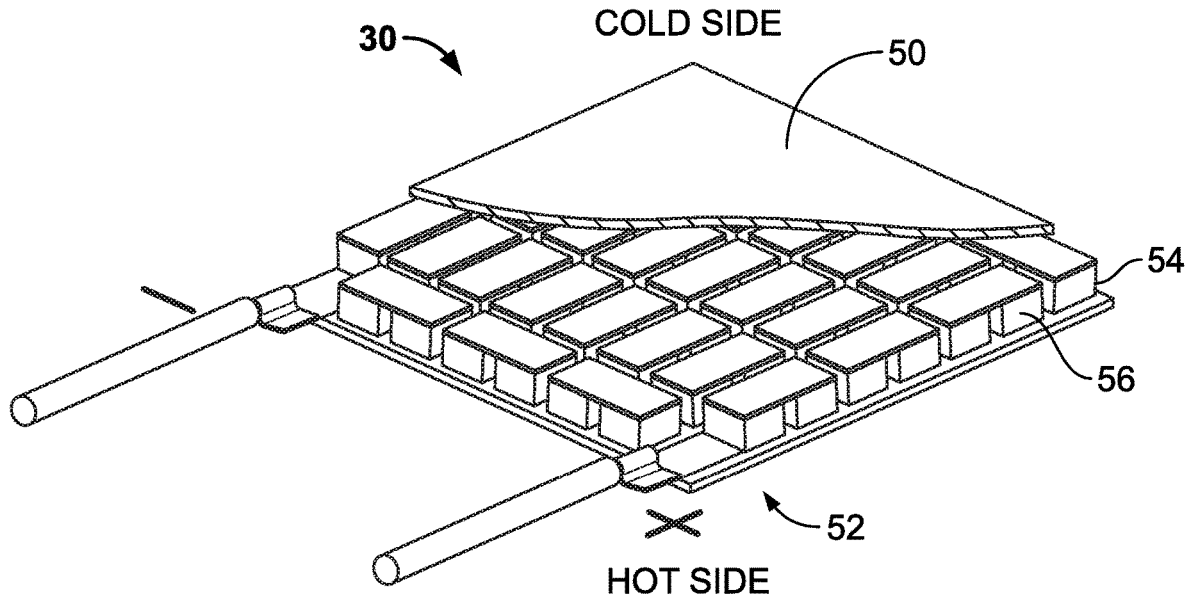
FIG. 6 is an exemplary thermoelectric generator (TEG).

Referring next to FIG. 6, an exemplary TEG 30 is shown. As described above, thermopiles 12 comprise multiple TEGs 30 connected in series, parallel, or combinations thereof. TEGs 30 directly convert heat into electric power. TEGs are solid-state heat engines and have no moving parts, making the TEGs robust and reliable in long-life applications in borehole environments. TEGs 30 are ideally suited for energy harvesting applications. A TEG 30 generates the Seebeck Voltage created when a temperature differential is maintained across a thermoelectric couple. Electrical current is then provided to a connected load. A TEG 30 includes P-type and N-type thermoelectric legs connected in series or series-parallel combination.

TEG 30 has a dielectric substrate, e.g., dense alumina, on the top surface 50 and the bottom surface 52 representing a cold surface and hot surface, respectively. Surfaces 50, 52 interface with the heat source and heat sink to transfer thermal energy. Edges are sealed to protect the thermoelectric elements. Heat source and heat sink (not shown) are attached to the top surface 50 and bottom surface 52 with good thermal interface material for efficient heat transfer. N-type semiconductors 54 are arranged alternating with P-type semiconductors 56 to form multiple thermoelectric couples.

Open circuit voltage of a TEG is defined as $Voc = S_{p-n} * dT * N$
where $S_{p-n}$ is the Seebeck coefficient of a P-N thermoelectric couple, e.g., for a BiTe-based TEG., $S_{p-n} \sim 400$ uV/K); dT is the temperature differential across the TEG; and N is the number of thermoelectric couples 54, 56 in TEG 30.

In an exemplary embodiment using a commercial thermoelectric module consisting of 125 couples of BiTe material, Voc and maximum Power output for 1 module at different dT are shown in Table 1 below:

TABLE 1

| dTt(K) | Voc | Power (mW) |
|---|---|---|
| 100 | 5.38 | 836.42 |
| 10 | .54 | 9.93 |
| 1 | 0.054 | 0.11 |

In the example TEG of FIG. 6, power output depends on the load. Load optimization is applied to achieve maximum power output. Depending on the resistive load, for maximum power transfer, the load voltage $V_{load}$~½ Voc. To generate sufficient power output and voltage output, several TEGs may be connected in series and parallel configuration. $V_{load}$ is proportional to dT and load power P is proportional to $dT^2$. Energy storage and power conditioning may be connected to thermopile 12. Since the power output P generated by the thermopiles 12 in the energy harvesting method is not constant, directly powering the sensors is inconsistent. One method to address the inconsistent power is to store the energy in a battery. Power conditioning circuit 34 supplies regulated power to sensors 32.

With thermal pulses >10K thermal gradients of >10K are generated. With no thermal pulses, the nominal expected dT may be much lower. Where 4 or 5 modules are attached to the tube 14 or casing 22 in a ring configuration, ten rings comprising about 40-50 TEGs at a dT of 10° K, a 16 Wh battery will fully charge in about 32 to 40 hours. In contrast, where dT equals 1° K, with one hundred rings of TEGs, or about 400-500 TEGs in total, the 16 Wh battery will fully charge in about two weeks. Power consumption of the sensors and wireless communication devices are relatively low. Assuming approximately 0.5 W consumption, the 16 Wh battery will fully discharge in about 30 hours. Sensors are generally rated between one to ten mW, providing extended battery life. Depending upon the sensor/power system and the frequency of thermal pulses, the generated power level is sufficient to power sensor 32. After closure, long-term monitoring at observational wells may use sensors that are dormant, and periodically activated with a thermal pulse for data collection and transmission.

Figure 7:
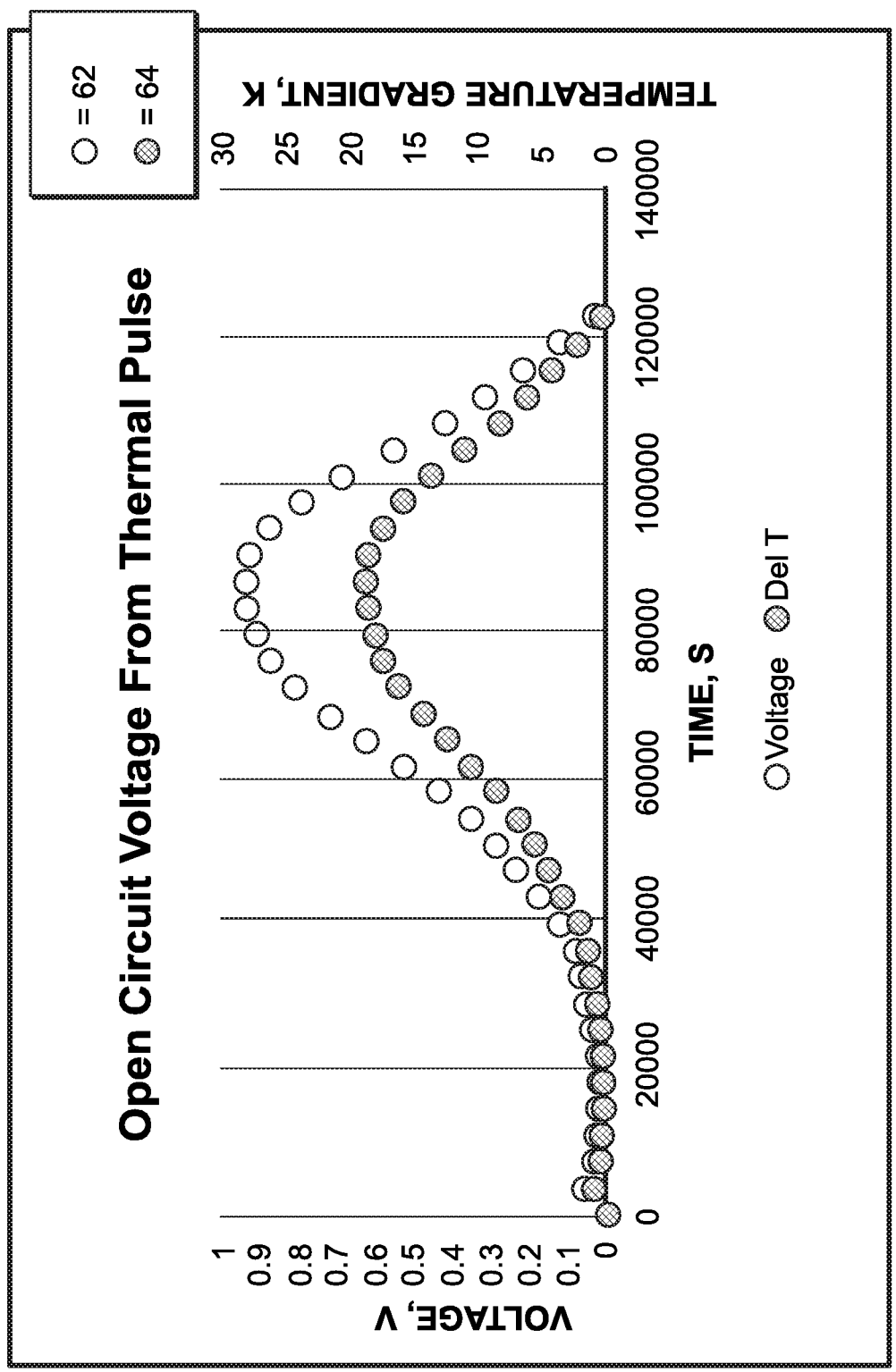
FIG. 7 is a graph showing a simulated open circuit voltage and temperature gradient of the thermopile resulting from a thermal pulse induced in a borehole.

Referring next to FIG. 7, a graph shows a simulation example for a borehole energy harvesting system. In the example of FIG. 7, an exemplary reservoir 42 initially at 70° C., cools near wellbore then returns to far-field temperature T. A spike in voltage is produced by a thermal pulse. Assuming the energy harvesting system 10 includes 125 TEGs in 1 shell module with Seebeck coefficient of 400 mV/K. The open circuit voltage Voc generated by the thermal pulse is represented by line 62. The temperature gradient, or dT, is represented by line 64. Both Voc and dT are represented as a function of time in seconds, from zero to 120,000.

It is important to note that the construction and arrangement of the energy harvesting system as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

It is further noted that although the figures herein may show a specific order of method steps, it is understood that the order of these steps may differ from what is depicted. Also, two or more steps may be performed concurrently or with partial concurrence. Such variation will depend on the software and hardware systems chosen and on designer choice. It is understood that all such variations are within the scope of the application. Likewise, software implementations could be accomplished with standard programming techniques with rule-based logic and other logic to accomplish the various connection steps, processing steps, comparison steps and decision steps.

While the exemplary embodiments illustrated in the figures and described herein are presently preferred, it should be understood that these embodiments are offered by way of example only. Accordingly, the present application is not limited to a particular embodiment but extends to various modifications that nevertheless fall within the scope of the appended claims. The order or sequence of any processes or method steps may be varied or re-sequenced according to alternative embodiments.

The invention claimed is:

1. A system for powering a borehole sensor with thermal energy, comprising:
a tubular pipe inserted into a subsurface borehole, a casing in thermal contact with an inner wall of the borehole; the casing coaxially disposed with the tubular pipe to form an annular space therebetween; a power source disposed within the borehole in electrical communication with the sensor; and the power source configured to generate an electrical power in response to a temperature gradient between a surface of the casing and a surface of the tubular pipe; and
wherein the power source comprises at least one thermopile comprising an array of thermoelectric generator (TEG) modules; and
wherein the at least one thermopile is disposed within the wall surface and embedded into a cement or rock formation.

2. The system of claim 1, wherein the TEG modules are configured to generate a predetermined voltage and current output for powering the sensor package.

3. The system of claim 1, further comprising a power conditioner module interconnected between an output terminal of thermopile and input terminal to the sensor package, the power conditioner configured to regulate the electrical signal input to the sensor.

4. The system of claim 1, wherein the at least one thermopile being attached to a longitudinal section or sections of the tubular pipe along an exterior surface.

5. The system of claim 1, wherein the thermopile further comprises a thermal conductor portion disposed between the tubing and the casing.

6. The system of claim 5, wherein the thermal conductor portion comprises a metallic element having efficient heat transfer properties.

7. The system of claim 6, wherein the metallic element comprises one of: a plurality of flexible metal fins, a mesh material, and a wire brush.

8. The system of claim 5, further comprising a thermal interface portions disposed on at least one end of the thermopile for conducting thermal energy to the thermal conductor portion or the production tubing.

9. The system of claim 1, wherein the TEG comprises a plurality of thermoelectric couples, comprising P-type thermoelectric leg and N-type thermoelectric leg alternately connected in series or series-parallel combination; and the TEG disposed between dielectric substrate portions, wherein TEG generates a voltage in response to a temperature gradient across the thermoelectric couples; wherein an electrical power is applied to the sensor.

10. The system of claim 9, wherein the TEG having an open circuit voltage Voc defined as $Voc=S_{p-n}*dT*N$, $S_{p-n}$ comprising the Seebeck coefficient of the thermoelectric couple; dT equal to a temperature differential across the TEG; for a number N equal to a number of thermoelectric couples of the TEG.

11. The system of claim 1, wherein the power source comprises a plurality of thermopiles attached around the tubular pipe.

12. A system for sensing environmental parameters in a subsurface borehole, comprising:
a tubular pipe inserted into a subsurface borehole, a casing in thermal contact with an inner wall of the borehole, the casing coaxially dispose with the tubular pipe to form an annular space therebetween;
a thermopile disposed within the borehole in electrical communication with the sensor, the thermopile configured to generate an electrical power in response to a temperature gradient between a surface of the casing and a surface of the tubular pipe; and
the thermopile configured to sense heat flux in response to changes in the thermal conductivity of a formation surrounding the borehole;
wherein the thermal conductivity determines saturation in the surrounding material and displacement of pore water in a casing cement of the surrounding formation due to hydrocarbon $scCO_2$ into the formation.

13. The system of claim 12, further comprising a plurality of thermopiles attached to the tubular pipe an $scCO_2$ injection field; and monitoring upward expansion of a $CO_2$ plume within a reservoir.

14. A method of harvesting thermal energy for powering a sensor in a subsurface borehole in a geological formation is disclosed, wherein the borehole includes an annular gap between a production tubing portion and a borehole casing, comprising:
attaching at least one thermopile on a surface of the borehole casing or the production tubing;
disposing the at least one thermopile in the annular between the borehole casing and the production tubing;
inducing a thermal gradient between the tubing and the casing across the at least one thermopile;
generating an electrical energy in response to the gradient;
powering the sensor from the generated electrical energy; and
monitoring a vertical expansion of a $CO_2$ plume adjacent the borehole.

15. The method of claim 14, further comprising generating a thermal pulse;
increasing temperature gradient and increase the heat flux into or out of the borehole;
harvesting energy via the thermopile in response to the thermal pulse;
generating charging power for a sensor; and
wirelessly charging the sensor.

16. The method of claim 15, further comprising:
drilling the borehole into a reservoir underlying an aquifer and a capstone layer;
configuring the at least one thermopile to monitor the vertical expansion of the $CO_2$ plume;
measuring parameters of the subsurface environment of the borehole; and
transmitting accumulated recorded data to a downhole tool.

17. The method of claim 15, further comprising:
sensing pressure, fluid conductivity, liquid saturation, or dielectric properties of pore fluids in cement on the exterior of the casing.

18. The method of claim 15, further comprising tracking fluid flow and fluid compositional changes.

19. A system for powering a borehole sensor with thermal energy, comprising:
a tubular pipe inserted into a subsurface borehole, a casing in thermal contact with an inner wall of the borehole; the casing coaxially disposed with the tubular pipe to form an annular space therebetween; a power source disposed within the borehole in electrical communication with the sensor; and the power source configured to generate an electrical power in response to a temperature gradient between a surface of the casing and a surface of the tubular pipe; and
wherein the power source comprises at least one thermopile comprising an array of thermoelectric generator (TEG) modules; and
wherein the TEG comprises a plurality of thermoelectric couples, comprising P-type thermoelectric leg and N-type thermoelectric leg alternately connected in series or series-parallel combination; and the TEG disposed between dielectric substrate portions, wherein TEG generates a voltage in response to a temperature gradient across the thermoelectric couples; wherein an electrical power is applied to the sensor.

20. The system of claim 19, wherein the TEG having an open circuit voltage Voc defined as $Voc=S_{p-n}*dT*N$, $S_{p-n}$ comprising the Seebeck coefficient of the thermoelectric couple; dT equal to a temperature differential across the TEG; for a number N equal to a number of thermoelectric couples of the TEG.

21. The system of claim 19, wherein the power source comprises a plurality of thermopiles attached around the tubular pipe.

* * * * *